(12) United States Patent
Tsubota et al.

(10) Patent No.: US 7,176,673 B2
(45) Date of Patent: Feb. 13, 2007

(54) DIRECT CURRENT DETECTION CIRCUIT

(75) Inventors: Yasuhiro Tsubota, Okayama (JP); Nobuyuki Toyoura, Okayama (JP); Masao Mabuchi, Okayama (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/901,249

(22) Filed: Jul. 27, 2004

(65) Prior Publication Data

US 2005/0030005 A1 Feb. 10, 2005

(30) Foreign Application Priority Data

Aug. 8, 2003 (JP) ............................. 2003-290269

(51) Int. Cl.
*G01R 15/18* (2006.01)
(52) U.S. Cl. .................................... 324/127
(58) Field of Classification Search ............... None
See application file for complete search history.

(56) References Cited

U.S. PATENT DOCUMENTS

| 4,280,162 A |   | 7/1981  | Tanka et al. |         |
|-------------|---|---------|--------------|---------|
| 4,289,946 A | * | 9/1981  | Yarwood et al. | 324/650 |
| 4,320,433 A |   | 3/1982  | Yamaki       |         |
| 4,415,896 A | * | 11/1983 | Allgood      | 324/127 |
| 4,933,633 A | * | 6/1990  | Allgood      | 324/142 |
| 5,856,902 A |   | 1/1999  | Hashimoto    |         |
| 6,504,357 B1 | * | 1/2003 | Hemminger et al. | 324/142 |

FOREIGN PATENT DOCUMENTS

| EP | 0661547  | 7/1995 |
| EP | 0986165  | 3/2000 |
| GB | 2251741  | 7/1992 |

OTHER PUBLICATIONS

European Search Report, Application No. EP04017130, Nov. 24, 2004.

* cited by examiner

*Primary Examiner*—Jermele Hollington
(74) *Attorney, Agent, or Firm*—Beyer Weaver & Thomas LLP

(57) ABSTRACT

A direct current detection circuit has a zero-phase current transformer with source lines inserted therethrough for detecting current differences among them and generates a comparison voltage value based on a divided voltage value obtained between the zero-phase current transformer and a voltage divider resistor according to a change in the self-impedance of the zero-phase current transformer. An offset current is passed through the zero-phase current transformer to make it possible to detect on the basis of the comparison voltage value a direct current value in a range which is otherwise difficult to detect accurately on the basis of the comparison voltage value because of influence of hysteresis characteristic of the zero-phase current transformer. A control circuit detects a present direct current value based on the comparison voltage value and the value of the offset current.

7 Claims, 10 Drawing Sheets

| OFFSET CURRENT | −60mA (NEGATIVE DIRECTION) | +60mA (POSITIVE DIRECTION) | −60mA (NEGATIVE DIRECTION) | +60mA (POSITIVE DIRECTION) |
|---|---|---|---|---|
| GROUNDING CURRENT | +30mA | +30mA | −30mA | −30mA |
| GROUNDING CURRENT +OFFSET CURRENT | −30mA | +90mA | −90mA | +30mA |
| COMPARISON VOLTAGE VALUE | V5≤VB | V5≥VA | V5≥VA | V5≤VB |

IDENTIFYING DIRECT GROUNDING CURRENT IN POSITIVE AND NEGATIVE DIRECTIONS ON THE BASIS OF WHETHER OR NOT V5≥VA.

| GROUNDING CURRENT | OFFSET CURRENT 60mA | OFFSET CURRENT 58mA | SHIFT IN COMPARISON VOLTAGE VALUE |
|---|---|---|---|
| When +30mA | +90mA | +88mA | V5 at 60mA is larger |
| When 0mA | +60mA | +58mA | V5 at 60mA is larger |
| When -30mA | +30mA | +28mA | V5 at 60mA is larger |
| When -90mA | -30mA | -32mA | V5 at 58mA is larger |
| When -120mA | -60mA | -62mA | V5 at 58mA is larger |

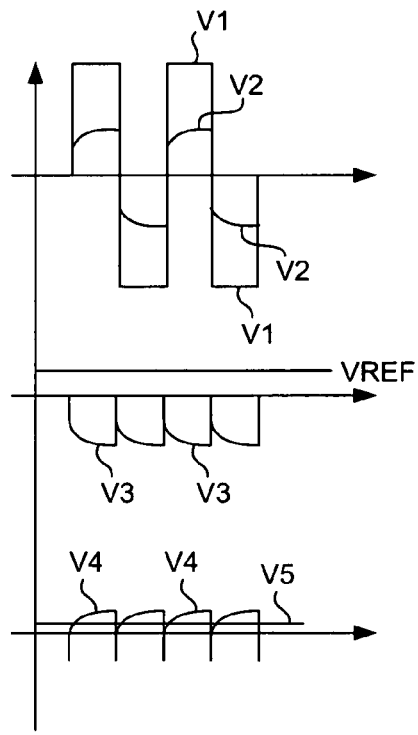
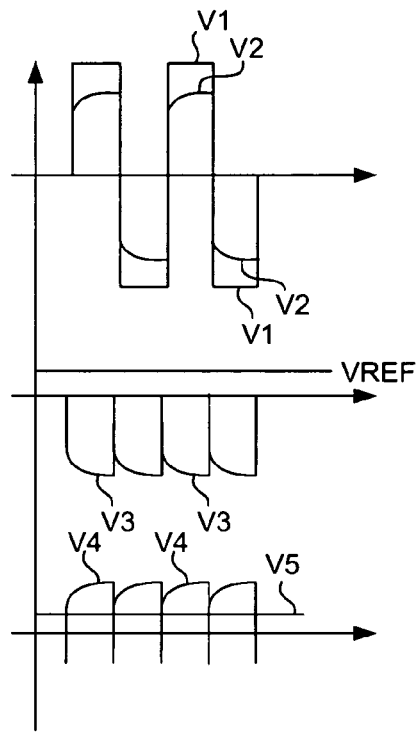
*FIG. 12A*
*(PRIOR ART)*
*FIG. 12B*
*(PRIOR ART)*
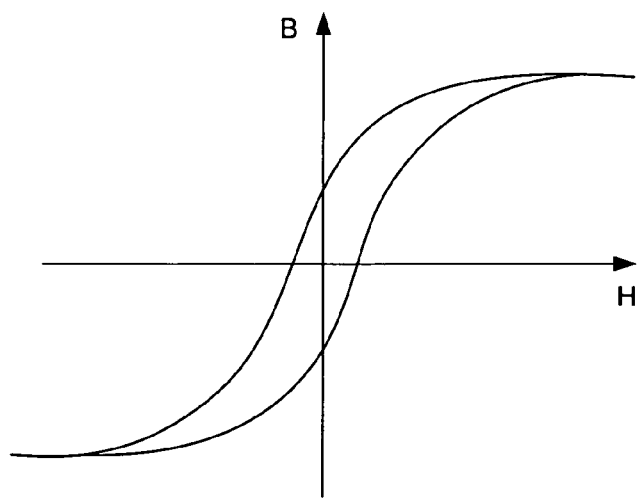
*FIG. 13*
*(PRIOR ART)*

US 7,176,673 B2

DIRECT CURRENT DETECTION CIRCUIT

Priority is claimed on Japanese Patent Application 2003-290269 filed Aug. 8, 2003.

BACKGROUND OF THE INVENTION

This invention relates to a direct current detection circuit for detecting a direct current value by using a zero-phase current transformer (hereinafter referred to as ZCT) making use of a magnetic material like as Permalloy, such as a direct grounding current detecting circuit for detecting the occurrence of a direct grounding current used, for example, for linkage protection of a linkage apparatus.

As an example of a direct grounding current detecting circuit serving as a direct current detecting circuit, Japanese Patent Publication Tokkai 11-122819 has disclosed the technology applicable to a linkage apparatus for converting direct-current power from a direct-current source into alternate-current power by using a current transformer to detect the difference between the current values flowing for the positive and negative terminals of the direct-current source and to judge according to the level of this current difference whether a direct grounding current is being generated.

With such a detection circuit, a direct grounding current accident of a system linkage apparatus can be prevented on the basis of the presence or absence of a direct grounding current because the occurrence of such a direct grounding current may be detected if the current difference detected by the current transformer exceeds a certain level while it is concluded that such a direct grounding current is absent if the detected current difference is found not to exceed this level.

The manner in which such a direct grounding current detecting circuit may be used in a linkage system is explained next with reference to FIG. 10 which is a block diagram showing the structure of a general linkage system 100 comprised of a system linkage apparatus 103 disposed between a direct current source 101 such as a solar battery and an alternate current system 102 such as a single-phase three-line type for converting the direct current power of the direct current source 101 into alternate current power. The system linkage apparatus 103 comprises an inverter 104 for converting the direct current power from the direct current source 101 into alternate current power, a linkage relay 105 for the ON/OFF control on the linkage with the alternate current system 102, a ZCT 10 for magnetically detecting the current difference between the U-phase source line 110A and the W-phase source line 110B between the inverter 104 and the alternate current system 102, a direct grounding current detection circuit 107 for detecting the presence or absence of a direct grounding current on the basis of the current difference detected by this ZCT 10 and a CPU 108 for controlling the inverter 104, the linkage relay 105, etc. on the basis of the detection result by the direct grounding current detection circuit 107.

The CPU 108 of the system linkage apparatus 103 serves to cut off the linkage with the alternate current system 102 by controlling the linkage relay 105 to be switched off when the direct grounding current detection circuit 107 detects the generation of a direct grounding current.

FIG. 11 is a block diagram for approximately showing the inner structure of the direct grounding current detection circuit 107. FIGS. 12A and 12B are waveform diagrams of various outputs for showing the operations of the direct grounding current detection circuit 107 respectively when it is judging that a direct grounding current is absent and present.

The direct grounding current detection circuit 107 comprises the aforementioned ZCT 10 having the U-phase source line 110A and the W-phase source line 110B inserted as explained above for magnetically detecting the current different therebetween and changing its self-impedance according to the change in the magnetic field generated by this current difference, an oscillator circuit 11 for generating a specified voltage V1, a voltage divider resistor 12 connected in series with the ZCT 10, a comparison voltage generating circuit 13 for generating a comparison voltage V5 on the basis of the voltage value V2 divided between the ZCT 10 and the voltage divider resistor 12 according to the change in the impedance of the ZCT 10 and a control circuit 14 for judging whether or not the comparison voltage V5 generated by the comparison voltage generating circuit 13 is above a threshold value for determining the presence or absence of a direct grounding current and detecting the presence or absence of the occurrence of a direct grounding current on the basis of the result of this judgment. In the above, the voltage value V2 is obtained as $Z1/(Z1+R1)*V1$ where Z1 is the impedance of the ZCT 10 and R1 is the resistance of the voltage divider resistor 12.

As shown in FIG. 11, the comparison voltage generating circuit 13 comprises a rectifier circuit 131 for detecting and rectifying the voltage value V2, an offset amplifier circuit 132 for offset-amplifying the output voltage V3 from this rectifier circuit 131 and a filter circuit 133 for filtering the output voltage V4 from this offset amplifier circuit 132 and thereby outputting a comparison voltage value V5.

The control circuit 14 judges that a direct grounding current has occurred relative to the source lines 110A and 110B if the comparison voltage value V5 from the comparison voltage generating circuit 13 is above a threshold value (a reference level) as shown in FIG. 12B, but that there is no occurrence of a direct grounding current if it is determined that the comparison voltage value V5 is not above the threshold value, as shown in FIG. 12A.

In summary, the prior art direct grounding current detection circuit 107 serves to generate the comparison voltage value V5 on the basis of the voltage value V2 divided by the ZCT 10 and the voltage divider resistor 12 according to the change in the impedance of the ZCT 10, determining the occurrence of a direct grounding current to be present or absence according to whether this comparison voltage value V5 is above or below the threshold value, and hence is capable of dependably detecting the presence or absence of a direct grounding current.

Although an example with an alternate current system with the single-phase three-line type was described above with reference to FIG. 10 with the U-phase and W-phase source lines 11A and 110B inserted through the ZCT 10, a similar effect can be obtained with a system of the single-phase two-line type by inserting the L-phase and N-phase source lines through the ZCT 10.

It is to be noted that the prior art direct grounding current detection circuit 107 employs a ZCT 10 made of Permalloy as its magnetic material for detecting the current difference between the source lines 110A and 110B. Since Permalloy has a hysteresis characteristic as shown in FIG. 13, the magnetic permeability-magnetization current characteristic of the ZCT 10 is as shown in FIG. 14. The prior art direct grounding current detection circuit 107 is therefore influenced by this hysteresis characteristic of its ZCT 10. If it is desired to detect the presence or absence of a direct grounding current of a very small value in the range of −30 mA to +30 mA (such as shown shaded in the graph of FIG. 15) such as 15 mA, the comparison voltage value V5 appears at two points and it becomes difficult to detect an accurate direct current value or to judge correctly if there is a direct grounding current.

This problem is not limited to the direct grounding current detection circuit 107. Direct current detection circuits are generally influenced by the hysteresis characteristic of their ZCT 10 and are not capable of accurately detecting a direct current value.

SUMMARY OF THE INVENTION

It is therefore an object of this invention in view of the above to provide a direct current detection circuit capable of accurately detecting the direct current value of the present moment without the influence of the hysteresis characteristic of the ZCT.

It is a particular object of this invention to provide a direct grounding current detection circuit capable of accurately detecting the occurrence of a direct grounding current without the influence of the hysteresis characteristic of the ZCT.

A direct current detection circuit according to this invention, in view of such objects, may be characterized not only as comprising a ZCT having source lines inserted therethrough and being adapted to magnetically detect current differences among these source lines and to vary its self-impedance according to changes in magnetic field generated by this current difference, a voltage divider resistor connected in series to the ZCT, a comparison voltage generating circuit for generating a comparison voltage value based on a divided voltage value obtained between the ZCT and the voltage divider resistor according to a change in the self-impedance of the ZCT, a control circuit for detecting a present direct current value based on the comparison voltage value generated by the comparison voltage generating circuit, an offset current line which is inserted through the ZCT and an offset current generating circuit for generating an offset current through the offset current line to make it possible to detect on the basis of the comparison voltage value a direct current value in a range which would be difficult to detect accurately on the basis of the comparison voltage value without the offset current because of the influence of the hysteresis characteristic of the ZCT, but also wherein the control circuit is adapted to detect a current value on the basis of the comparison voltage value generated by the comparison voltage generating circuit and to calculate the present direct current value on the basis of the detected value and the value of the offset current.

Another direct current detection circuit according to another embodiment of this invention may be characterized not only as further comprising a compensatory ZCT having the same characteristics as the aforementioned ZCT, having the source lines inserted therethrough and having inserted therethrough the offset current line such that an opposite offset current which is opposite in direction to the offset current is detected thereby, a compensatory voltage divider resistor connected in series to the compensatory ZCT, and a compensatory comparison voltage generating circuit for generating a compensatory comparison voltage value based on another divided voltage value obtained between the compensatory ZCT and the compensatory voltage divider resistor according to a change in the self-impedance of the compensatory ZCT, but also wherein the control circuit includes a current value calculating circuit adapted to detect a current value in a positive direction based on the comparison voltage value generated by the comparison voltage generating circuit, to calculate a direct current value in the positive direction based on the current value in the positive direction and the current value of the offset current, to detect a current value in the negative direction based on the compensatory comparison voltage value generated by the compensatory comparison voltage generating circuit, and to calculate a direct current value in the negative direction based on the current value in the negative direction and the current value of the offset current and a present current value detection circuit adapted to selectively detect the direct current value in the positive direction as the present direct current value if the comparison voltage value is judged to be higher than the compensatory comparison voltage value and to selectively detect the direct current value in the negative direction as the present direct current value if the compensatory comparison voltage value is judged to be higher than the comparison voltage value.

Still another direct current detection circuit according to a third embodiment of this invention may be further characterized wherein the offset current generating circuit generates an offset current with different current values for every specified period and the control circuit includes a direct current value calculating circuit for detecting current values in the positive and negative directions based on the comparison voltage value generated by the comparison voltage generating circuit and calculating a direct current value in positive direction based on the current value in the positive direction and the current value of the offset current and a direct current value in negative direction based on the current value in the negative direction and the current value of the offset current, a monitoring circuit for monitoring shift in relationship between the current value of the offset current and the comparison voltage value, and a present current value detection circuit for detecting the direct current value in positive direction as the present direct current value if the monitor circuit finds that the comparison voltage value becomes higher as the offset current value becomes higher and detecting the direct current value in negative direction as the present direct current value if the monitor circuit finds that the comparison voltage value becomes lower as the offset current value becomes higher.

Still another direct current detection circuit according to a fourth embodiment of this invention may be characterized not only as comprising a ZCT having source lines inserted therethrough and being adapted to magnetically detect current differences among the source lines and to vary its self-impedance according to changes in magnetic field generated by the current difference, a voltage divider resistor connected in series to the ZCT, a comparison voltage generating circuit for generating a comparison voltage value based on a divided voltage value obtained between the ZCT and the voltage divider resistor according to a change in the self-impedance of the ZCT, and a control circuit for detecting a present direct current value based on the comparison voltage value generated by the comparison voltage generating circuit, but also wherein the ZCT has the source lines inserted therethrough a plural number of times so as to make it possible to detect on the basis of the comparison voltage value a direct current value in a range which is otherwise difficult to detect accurately on the basis of the comparison voltage value because of influence of hysteresis characteristic of the ZCT, and wherein the control circuit is adapted to detect a current value on the basis of the comparison voltage value generated by the comparison voltage generating circuit and to calculate the present direct current value on the basis of the detected value and the value of a direct current value passing through the source lines passing through the ZCT the plural number of times.

A direct grounding current detection circuit embodying this invention, in view of the aforementioned object of the invention, may be characterized not only as comprising a ZCT having source lines inserted therethrough and being adapted to magnetically detect current differences among the source lines and to vary self-impedance according to changes in magnetic field generated by the current difference, a voltage divider resistor connected in series to the ZCT, a comparison voltage generating circuit for generating a comparison voltage value based on a divided voltage value obtained between the ZCT and the voltage divider resistor according to a change in the self-impedance of the ZCT, a control circuit for detecting presence or absence of direct grounding current relative to the source lines based on the comparison voltage value generated by the comparison voltage generating circuit, an offset current line which is inserted through the ZCT, an offset current generating circuit for generating an offset current through the offset current line to shift a range of current values where it is difficult to accurately detect a direct current value of the direct grounding current because of influence of hysteresis characteristic of the ZCT into a detectable range where it is possible to detect the direct current value of the direct grounding current, and a threshold memory storing an upper threshold value and a lower threshold value to be used in determining presence and absence of the direct grounding current in the detectable range, but also wherein the control circuit is adapted to conclude that there is occurrence of the direct grounding current relative to the source lines if it is judged that the comparison voltage value is equal to or above the upper threshold value or equal to or below the lower threshold value.

Another direct grounding current detection circuit according to a second embodiment of the invention may be characterized as further comprising a compensatory ZCT having same characteristics as the ZCT, having the source lines inserted therethrough and having inserted therethrough the offset current line such that an opposite offset current which is opposite in direction to the offset current is detected thereby, a compensatory voltage divider resistor connected in series to the compensatory ZCT, and a compensatory comparison voltage generating circuit for generating a compensatory comparison voltage value based on another divided voltage value obtained between the compensatory ZCT and the compensatory voltage divider resistor according to a change in the self-impedance of the compensatory ZCT, and wherein the control circuit includes a judging circuit adapted to judge that a direct grounding current has occurred in a positive direction if the comparison voltage value generated by the comparison voltage generating circuit is equal to or above the upper threshold value and that a direct grounding current has occurred in the negative direction if the compensatory comparison voltage value generated by said compensatory comparison voltage generating circuit is equal to or above the upper threshold value.

Still another direct grounding current detection circuit according to a third embodiment of the invention may be further characterized wherein the offset current generating circuit generates an offset current with different current values for every specified period and the control circuit includes a monitoring circuit for monitoring shift in relationship between the current value of the offset current and the comparison voltage value when it is judged that a direct grounding current has occurred relative to the source lines, and a detection circuit for detecting the direct current value in a positive direction if the monitoring circuit finds that the comparison voltage value becomes higher as the offset current value becomes higher and detecting the direct current value in a negative direction opposite the positive direction if the monitoring circuit finds that the comparison voltage value becomes lower as the offset current value becomes higher.

Still another direct grounding current detection circuit according to a fourth embodiment of the invention may be characterized not only as comprising a ZCT having source lines inserted therethrough and being adapted to magnetically detect current differences among the source lines and to vary the self-impedance according to changes in magnetic field generated by the current difference, a voltage divider resistor connected in series to the ZCT, a comparison voltage generating circuit for generating a comparison voltage value based on a divided voltage value obtained between the ZCT and the voltage divider resistor according to a change in the self-impedance of the ZCT, and a control circuit for detecting presence or absence of occurrence of a direct grounding current relative to the source lines based on the comparison voltage value generated by the comparison voltage generating circuit, but also wherein the ZCT has the source lines inserted therethrough a plural number of times so as to shift a range of direct current values where it is difficult to accurately detect a direct current value of the direct grounding current because of influence of hysteresis characteristic of the ZCT into a detectable range where it is possible to detect the direct current value of the direct grounding current based on the comparison voltage value.

With a circuit thus structured, an offset current is passed through a ZCT such that the range or current values in which it is difficult to accurately detect a direct current value such as a direct grounding current value based on a comparison voltage value because of the influence of hysteresis characteristic of the ZCT will be sufficiently shifted to a detectable range in which such detection is possible. As a result, a present direct current value such as a direct grounding current value can be detected accurately without being affected by the hysteresis characteristic of the ZCT.

BRIEF DESCRIPTION OF THE DRAWINGS

FIG. 12, including FIGS. 12A and 12B, is a waveform diagram for the direct grounding current detection circuit of FIG. 11, when it is determined that there is no direct grounding current (as shown in FIG. 12A) and when it is determined that there is a direct grounding current (as shown in FIG. 12B).

FIG. 13 shows a typical hysteresis characteristic of a ZCT in a prior art direct grounding current detection circuit.

DETAILED DESCRIPTION OF THE INVENTION

Figure 1:
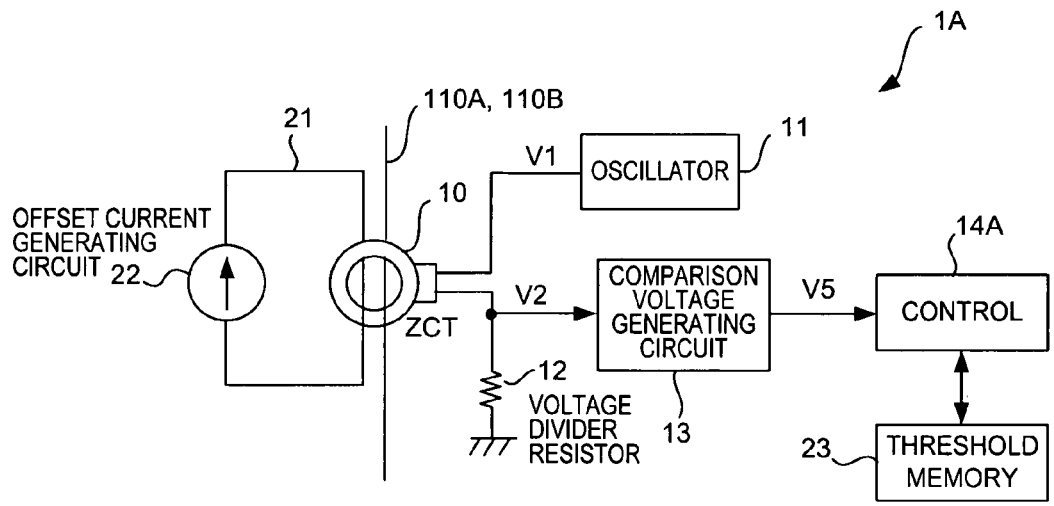
FIG. 1 is a block diagram of the inner structure of a direct grounding current detection circuit according to a first embodiment of the invention.
Figure 10:
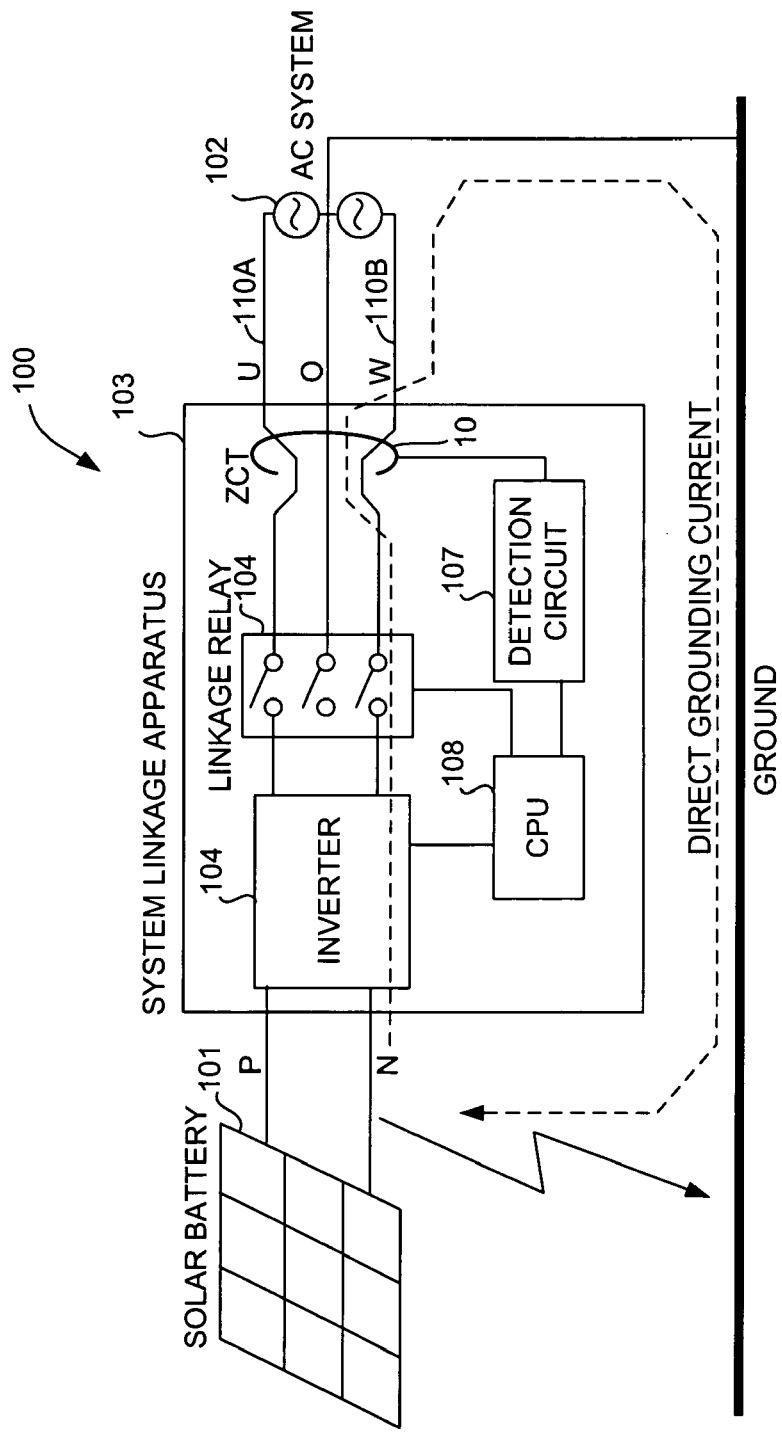
FIG. 10 is a block diagram of a general linkage system.
Figure 11:
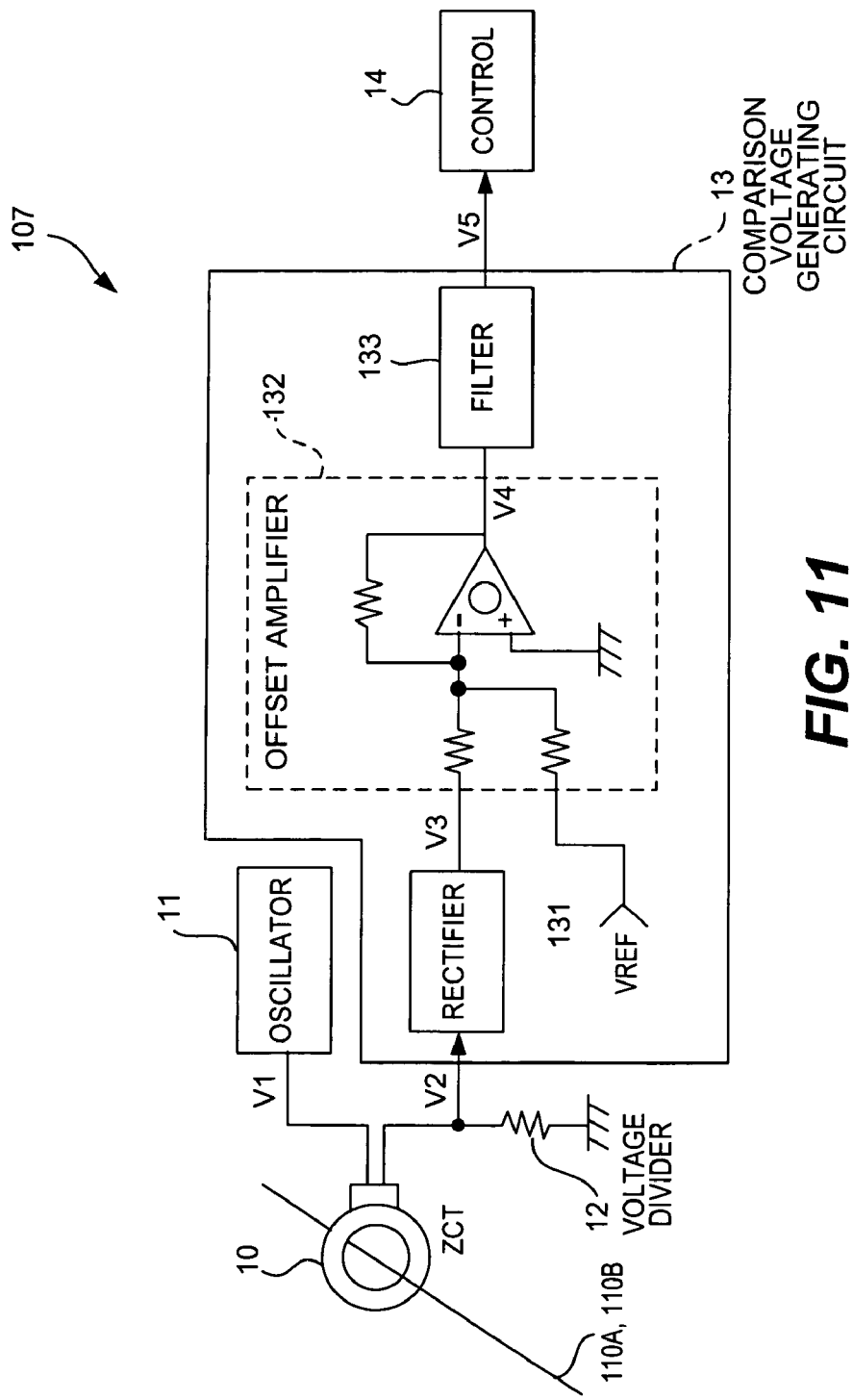
FIG. 11 is a block diagram of the inner structure of a prior art direct grounding current detection circuit.
Figure 14:
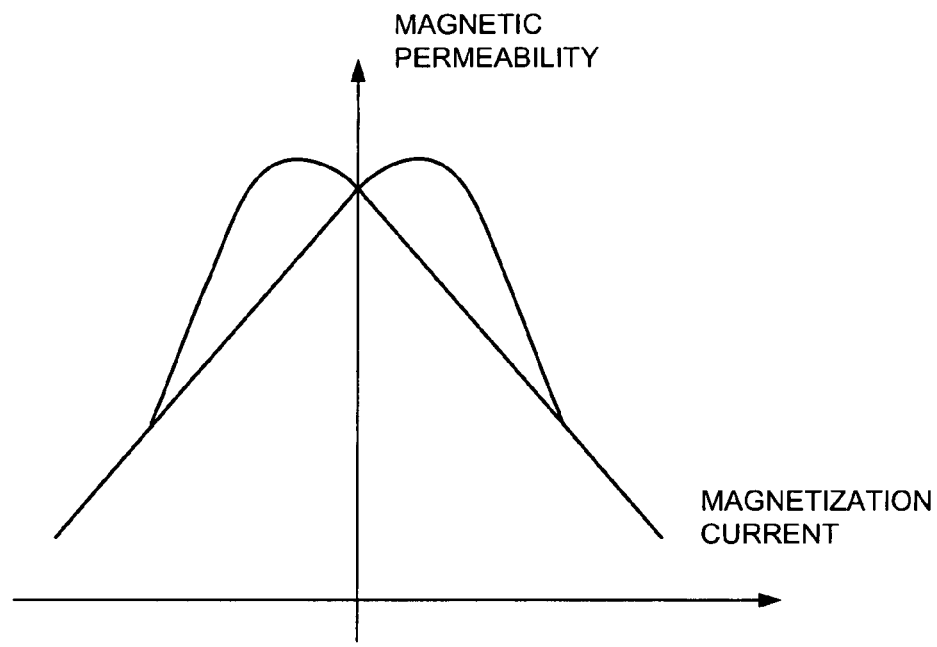
FIG. 14 shows the principle of how the magnetic permeability-magnetization current characteristic of a ZCT in a prior art direct grounding current detection circuit is affected.
Figure 15:
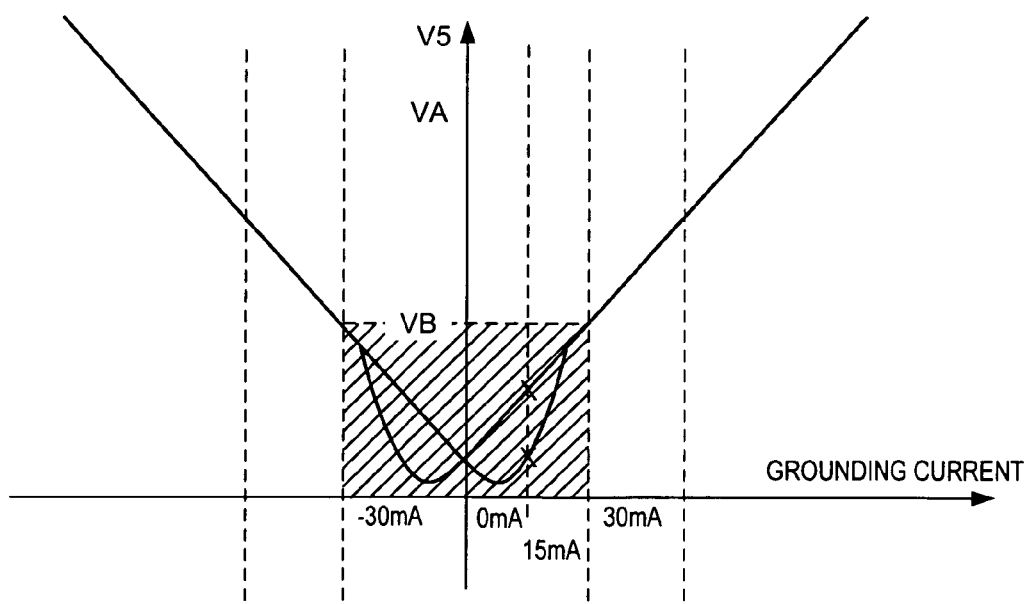
FIG. 15 shows the relationship between the comparison voltage value and the direct current value for a prior art direct grounding current detection circuit.

The invention is described next by way of several embodiments. FIG. 1 is a block diagram showing the inner structure of a direct grounding current detection circuit 1A according to one (first) embodiment of this invention. Those of its components that are similar or equivalent to those already shown in and explained above with reference to FIG. 10 are indicated by the same numerals.

The direct grounding current detection circuit 1A of this invention comprises not only a ZCT 10 with source lines 110A and 110B passing therethrough, an oscillator circuit 11, a voltage divider resistor 12 and a comparison voltage generating circuit 13, but also an offset current wire 21, an offset current generating circuit 22, a threshold memory 23 and a control circuit 14A. The offset current generating circuit 22 is for generating an offset current such as 60 mA and causing it to constantly flow through the offset current wire 21 such that a range X (shaded in FIG. 2) of current in which the value of the direct grounding current is difficult to detect from the comparison voltage value V5 as explained above because of the influence of the hysteresis characteristic of the ZCT 10 can be shifted to another range where such detection is possible. The threshold memory 23 is a memory device for storing an upper threshold value VA and a lower threshold value VB corresponding to a direct current value related to the determination of the occurrence of a direct grounding current within the range wherein the detection is possible as explained above. The control circuit 14A serves to judge that a direct grounding current occurred relative to the source lines 110A and 110B if the comparison voltage value V5 generated by the comparison voltage generating circuit 13 is found to be above the upper threshold value VA or below the lower threshold value VB.

Figure 2:
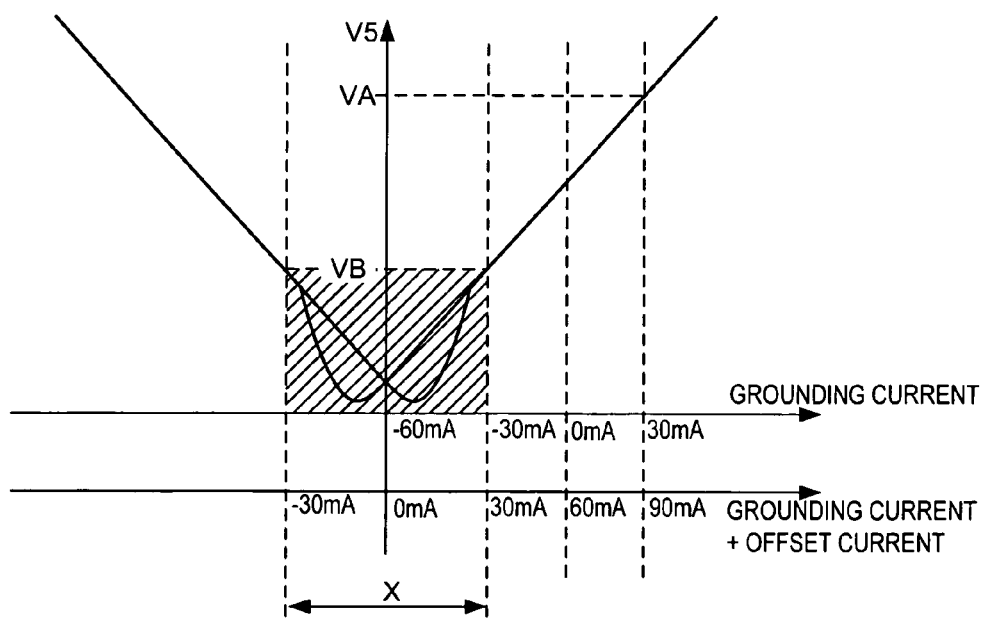
FIG. 2 is a graph for showing the relationship between the comparison voltage value and the direct current value for the direct grounding current detection circuit of FIG. 1 according to the first embodiment of the invention.

Next, the operation of the direct grounding current detection circuit 1A as described above will be explained. As a result, the range of current values (such as from −30 mA to +30 mA) in which the direct current value could not detected accurately because of the effect of the hysteresis characteristic of the ZCT 10 is shifted as shown in FIG. 2 into a range from +30 mA to +90 mA which is not influenced by the hysteresis characteristic of the ZCT 10. As a result, the direct grounding current in the range of from −30 mA to +30 mA can be accurately detected on the basis of the comparison voltage value V5.

When the voltage value V2 divided between the ZCT 10 and the voltage divider resistor 12 according to the change in the impedance of the ZCT 10 is detected, the comparison voltage generating circuit 13 generates the comparison voltage value V5 on the basis of this divided voltage value V2 and transmits this generated comparison voltage value V5 to the control circuit 14A.

As the comparison voltage value V5 is detected, the control circuit 14A determines whether or not it is above the upper threshold VA. If it is determined to be equal to or above the upper threshold VA, it concludes that the direct grounding current is equal to or greater than 30 mA and hence that the direct grounding current relative to the source lines 110A and 110B has occurred. The control circuit 14A also serves to determine whether or not the comparison voltage value V5 is equal to or below the lower threshold value VB. If it is determined to be equal to or below the lower threshold value VB, it concludes that the direct grounding current is equal to or below −30 mA and hence that the direct grounding current relative to the source lines 110A and 110B has occurred. If the comparison voltage value V5 is found to be neither equal to or above the upper threshold value VA nor equal to or below the lower threshold value VB, the control circuit 14A concludes that there is no occurrence of direct grounding current relative to the source lines 110A and 110B.

According to this first embodiment of the invention, an offset current is caused to flow through the ZCT 10 such that the minimum current range which is influenced by the hysteresis characteristic of the ZCT 10 is shifted to another range (the detectable range) where the detection of direct current value based on the comparison voltage value V5 is possible, while the upper and lower threshold values VA and VB for the judgment of presence or absence of direct grounding current relative to the source lines 110A and 110B are stored in a memory. Thus, the presence or absence of the occurrence of direct grounding current can be dependably determined without the influence of the hysteresis characteristic of the ZCT 10.

Although the first embodiment of the invention was described above by way of the direct grounding current detection circuit 1A, it goes without saying that it can be applied to a direct current detection circuit for the detection of a direct current value at the present time. In this case, too, since an offset current is used to shift the range of detection, it becomes possible to detect a current value based on the comparison voltage value V5 and since this detected current value may be regarded as the current value at the present time, the detection can be made dependably without the influence of the hysteresis characteristic of the ZCT 10.

Figures 4, 5:
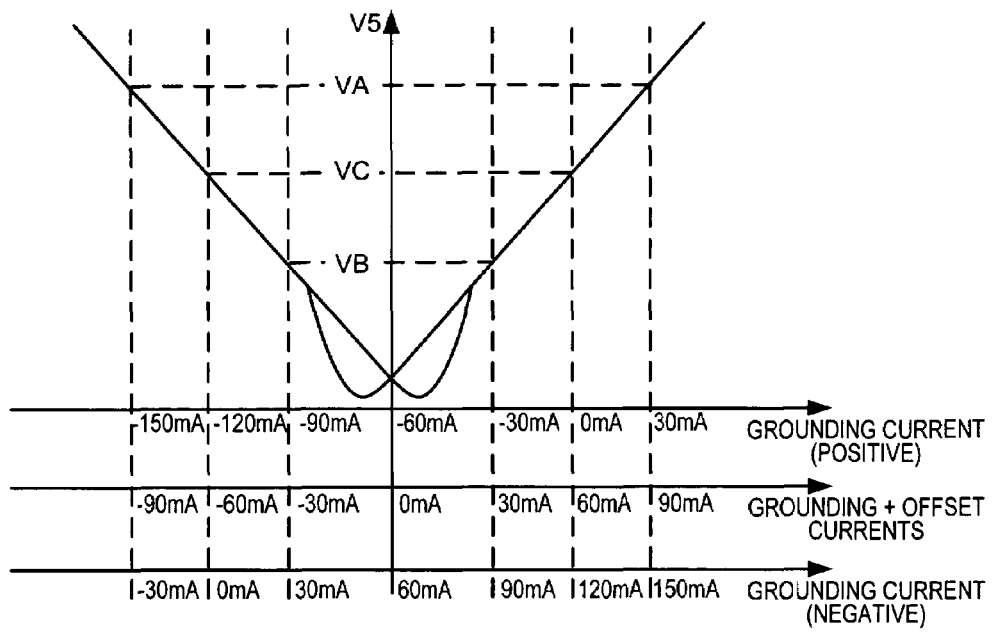
FIG. 4 is a graph for showing the relationship between the comparison voltage value and the direct current value for the direct grounding current detection circuit of FIG. 3 according to the second embodiment of the invention.
FIG. 5 shows an example of relationship between the direct grounding current and the comparison voltage value for each offset current for the direct grounding current detection circuit of FIG. 3 according to the second embodiment of the invention.

When the direct grounding current detection circuit 1A according to the first embodiment of the invention finds that the comparison voltage value V5 is equal to or above the upper threshold value VA, it is concluded that a direct grounding current has occurred, as explained above, but when the comparison voltage value V5 is equal to or above the upper threshold value, the direct grounding current may be in the positive direction, being equal to or greater than 30 mA, or in the negative direction, being equal to or greater (in absolute value) than 150 mA, as shown in FIG. 4. Similarly, when the comparison voltage value V5 is equal to or below the lower threshold value VB, the direct grounding current may be between 30 mA and 90 mA in the negative direction. In the above, a direct grounding current in the positive (negative) direction means a current in the positive (negative) direction with respect to the 0 mA of the total of the "direct grounding current" and the "offset current" as shown in FIG. 4.

The flow direction of the direct grounding current can be determined accurately by continuing to monitor the direct grounding current based on the comparison voltage value V5 equal to or below the lower threshold value VB. This method of determining whether the direct grounding current is flowing in the positive direction or in the negative direction by continuing to monitor the direct current value is applicable only if the variation in the direct grounding current is slow and gentle. When the direct grounding current changes suddenly from 0 mA to −150 mA, for example, it may be erroneously concluded to be a direct grounding current in the positive direction although the comparison voltage value is actually above the upper threshold value VA because it is not possible to continue monitoring the changes in the direct current value based on the comparison voltage value V5.

Figure 3:
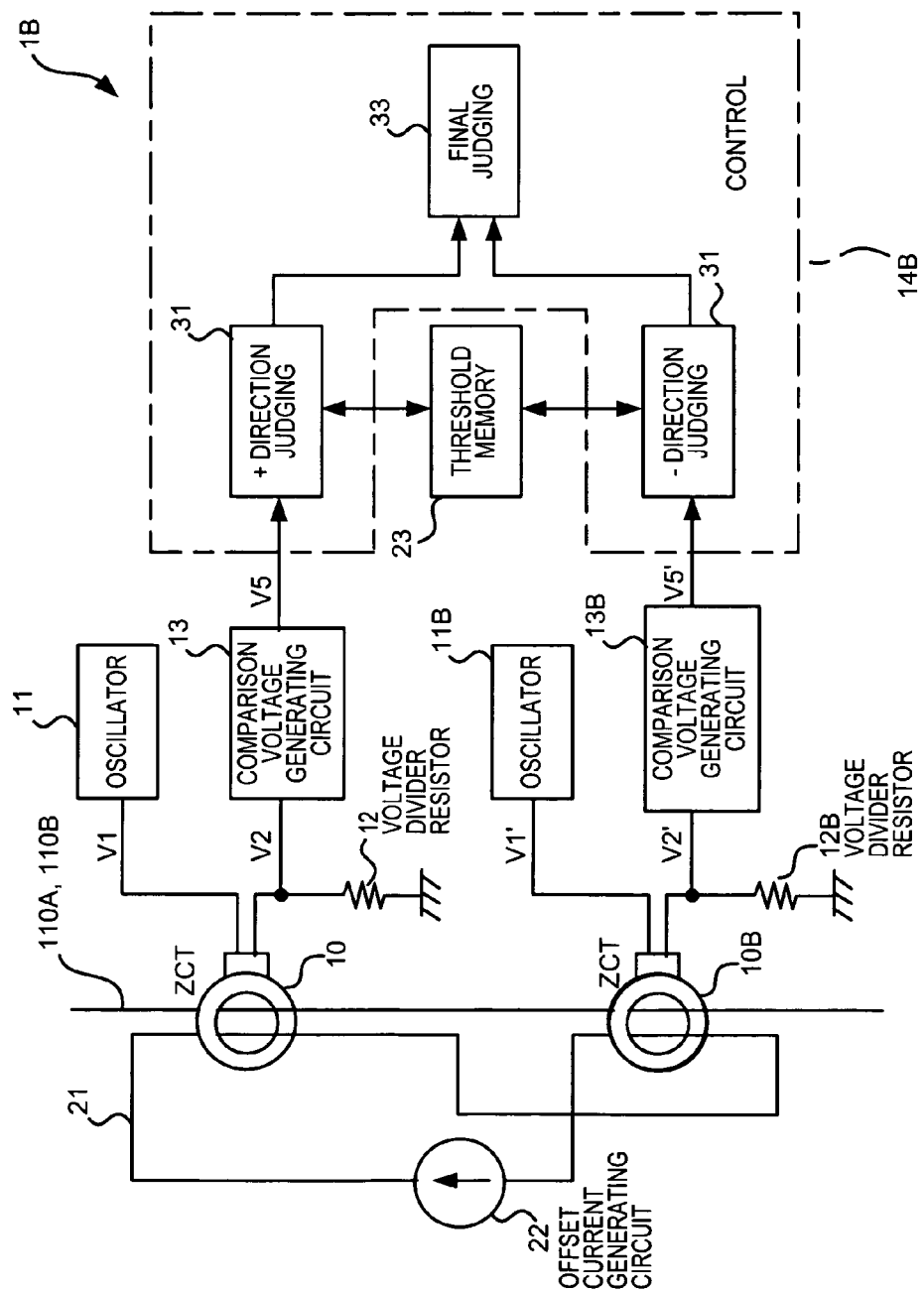
FIG. 3 is a block diagram of the inner structure of a direct grounding current detection circuit according to a second embodiment of the invention.

FIG. 3 is a block diagram of another direct grounding current detection circuit 1B according to a second embodiment of this invention, adapted to be able to determine whether a direct grounding current is in the positive or negative direction although its occurrence takes place suddenly. Components which are substantially the same as those shown above in FIG. 1 are indicated by the same numerals and their structures and functions may not be described repetitiously.

The direct grounding current detection circuit 1B shown in FIG. 3 comprises not only a ZCT 10 with source lines 110A and 110B and an offset current wire 21 passing therethrough, an oscillator circuit 11, a comparison voltage generating circuit 13, an offset current generating circuit 22 and a threshold memory 23 but also another (compensatory) ZCT 10B, another (compensatory) voltage divider resistor 12B, another (compensatory) comparison voltage generating circuit 13B and a control circuit 14B. The compensatory ZCT 10B has the same characteristics as the first ZCT 10 and has inserted therethrough not only the source lines 110A and 110B but also the offset current wire 21 in such a way that an offset current in the opposite direction to the offset current detected by the first ZCT 10 is detected. The compensatory voltage divider resistor 12B has the same characteristics as the first voltage divider resistor 12 described above with reference to FIG. 1 and is connected in series with the compensatory ZCT 10B. The compensatory voltage generating circuit 13B is for generating a compensatory comparison voltage value on the basis of a divided voltage value obtained between the compensatory ZCT 10B and the compensatory voltage divider resistor 12B according to the change in the impedance of the compensatory ZCT 10B. The control circuit 14B serves to judge the presence or absence of a direct grounding current relative to the source lines 110A and 110B on the basis of the stored content of the threshold memory 23, the comparison voltage value or the compensatory comparison voltage value.

The offset current which flows through the compensatory ZCT 10B will be (−60 mA) opposite in direction to the offset current (+60 mA) which flows through the first ZCT 10.

The voltage generating circuit 13 is for judging the presence of a direct grounding current in the positive direction on the basis of the comparison voltage value V5, while the compensatory comparison voltage generating circuit 13B is for judging the presence of a direct grounding current in the opposite (negative) direction on the basis of the compensatory comparison voltage value V5'.

The control circuit 14B comprises a judging circuit 31 for direct grounding current in the positive direction for judging whether or not the comparison voltage value V5 generated by the comparison voltage generating circuit 13 is equal to or above the upper threshold value VA, another judging circuit 32 for direct grounding current in the negative direction for judging whether or not the compensatory comparison voltage value V5' generated by the compensatory comparison voltage generating circuit 13B is equal to or above the upper threshold value VA, and a final judging circuit 33 for judging on the basis of the results of judgments by these two judging circuits 31 and 32 not only whether or not a direct grounding current has occurred but, if it is determined that there was an occurrence, also whether a direct grounding current in the positive direction or in the negative direction has occurred. In summary, the final judging circuit 33 concludes that a direct grounding current has occurred in the positive direction if the comparison voltage value V5 is judged to be equal to or above the upper threshold value VA by the judging circuit 31 for the positive direction and that a direct grounding current has occurred in the negative direction if the compensatory comparison voltage value V5' is judged to be equal to or above the upper threshold value VA by the judging circuit 32 for the negative direction. In other words, the direction of the direct grounding current is determined, depending upon whether the comparison voltage value or the compensatory comparison voltage value is equal to or above the upper threshold value VA.

Next, the principle of thus judging the direction of the direct grounding current (that is, depending on whether the comparison voltage value or the compensatory comparison voltage value is equal to or above the upper threshold value VA) will be explained with reference to FIGS. 4 and 5. FIG. 4 shows the relationship between the comparison voltage value V5 and the direct current values (for the direct grounding current and the sum of the direct grounding current and the offset current) in the case of the direct grounding current detection circuit 1B according to the second embodiment of the invention. FIG. 5 shows an example of relationship between the direct grounding current and the comparison voltage value for each offset current for the direct grounding current detection circuit of FIG. 2 according to the second embodiment of the invention.

As shown in FIGS. 4 and 5, it will be assumed that an offset current of +60 mA flows through the ZCT 10 and that of −60 mA through the compensatory ZCT 10B. Let us further assume that a direct grounding current of +30 mA has occurred through the ZCT 10 and the compensatory ZCT 10B. This means, as shown in FIGS. 4 and 5, a total current of +90 mA (=+30 mA of direct grounding current and +60 mA of offset current) flows through the ZCT 10 while the total current through the compensatory ZCT 10B is −30 mA (=+30 mA of direct grounding current and −60 mA of offset current).

The comparison voltage generating circuit 13 generates the comparison voltage V5 on the basis of the voltage value V2 divided between the ZCT 10 and the voltage divider resistor 12 according to the change in the impedance of the ZCT 10. In this case, the value of the comparison voltage V5 becomes the same as the upper threshold value VA, as shown in FIG. 4, and the sum of the direct grounding current and the offset current becomes 90 mA.

The compensatory comparison voltage generating circuit 13B generates the compensatory comparison voltage V5' on the basis of the voltage value V2' divided between the compensatory ZCT 10B and the compensatory voltage divider resistor 12B according to the change in the impedance of the compensatory ZCT 10B. In this case, the value of the compensatory comparison voltage V5 becomes the same as the lower threshold value VB, as shown in FIG. 4, and the sum of the direct grounding current and the offset current becomes −30 mA.

In summary, although the same direct grounding current of +30 mA is flowing through both the ZCT 10 and the compensatory ZCT 10B, the comparison voltage value V5 becomes greater than the upper threshold value while the compensatory comparison voltage value V5' becomes below the lower threshold value. In other words, from the point of view that the actual direct grounding current value is 30 mA, it may be concluded that it is the comparison voltage value V5 found to be above the upper threshold value VA that is correct.

When a direct grounding current of −30 mA is flowing, on the other hand, a total current (with the offset current) of +30 mA flows through the ZCT 10 while the total current that flows through the compensatory ZCT 10B is −90 mA. Thus, as shown in FIG. 4, a comparison voltage value V5 below the lower threshold value VB is generated by the comparison voltage generating circuit 13 while a compensatory comparison voltage value V5' above the upper threshold value VA is generated by the compensatory comparison voltage generating circuit 13B. From the point of view that the actual direct grounding current value is −30 mA, by contrast, it may be concluded that it is the compensatory comparison voltage value V5' found to be above the upper threshold value VA that is correct.

Thus, it is concluded that a direct grounding current in the positive direction has occurred if it is the comparison voltage value V5 that is found to be equal to or above the upper threshold value and that a direct grounding current in the negative direction has occurred if it is the compensatory comparison voltage value V5' that is found to be equal to or above the upper threshold value.

Next, the operation of the comparison voltage generating circuit 1B according to the second embodiment of the invention will be described. With reference still to FIG. 3, it will be assumed that an offset current of +60 mA flows through the ZCT 10 and that of −60 mA flows through the compensatory ZCT 10B.

The comparison voltage generating circuit 13 serves to generate a comparison voltage value V5 from the voltage value V2 obtained between the ZCT 10 and the voltage divider resistor 12 and transmits this generated comparison voltage value V5 to the judging circuit 31 for direct grounding current in the positive direction. The compensatory comparison voltage generating circuit 13B serves to generate a compensatory comparison voltage value V5' from the voltage value V2' obtained between the compensatory ZCT 10B and the compensatory voltage divider resistor 12B and transmits this generated compensatory comparison voltage value V5' to the judging circuit 32 for direct grounding current in the negative direction.

The judging circuit 31 for direct grounding current in the positive direction examines whether or not the comparison voltage value V5 is equal to or above the upper threshold value VA and transmits the result of this judgment to the final judging circuit 33. The judging circuit 32 for direct grounding current in the negative direction examines whether or not the compensatory comparison voltage value V5' is equal to or above the upper threshold value VA and transmits the result of this judgment to the final judging circuit 33.

The final judging circuit 33 concludes that a direct grounding current in the positive direction has occurred if the judging circuit 31 for direct grounding current in the positive direction judges that the comparison voltage value V5 is equal to or above the upper threshold value VA. The final judging circuit 33 concludes that a direct grounding current in the negative direction has occurred if the judging circuit 32 for direct grounding current in the negative direction judges that the compensatory comparison voltage value V5' is equal to or above the upper threshold value VA.

In summary, the second embodiment is characterized as additionally comprising a compensatory ZCT 10B having the same characteristic as the first ZCT 10, connected in series with a compensatory voltage divider and having an offset wire 21 and source lines 110A and 110B inserted therethrough such that an offset current opposite to that detected by the first ZCT 10 will be detected thereby, as well as a compensatory comparison voltage generating circuit 13B for generating a compensatory comparison voltage based on a voltage value obtained between the compensatory ZCT 10B and the compensatory voltage divider resistor 12B according to the change in the impedance of the compensatory ZCT 10B. It is concluded that a direct grounding current in the positive direction has occurred if the comparison voltage value generated by the comparison voltage generating circuit is found to be equal to or above the upper threshold value VA but that a direct grounding current in the negative direction has occurred if the compensatory comparison voltage value generated by the compensatory comparison voltage generating circuit is found to be equal to or above the upper threshold value VA. Thus, not only the presence or absence of a direct grounding current but also its direction, even if its occurrence has been sudden, can be accurately detected without being influenced by the hysteresis characteristic of the ZCT 10.

It now goes without saying that the second embodiment of this invention described above as applied to a direct grounding current detection circuit can be equally applicable to a direct current detection circuit for detecting a direct current value in either positive or negative direction. This may be done by calculating the direct current value in the positive direction on the basis of the comparison voltage value and the direct current value in the negative direction on the basis of the compensatory comparison voltage value, detecting the direct current value in the positive direction as the present direct current value if the comparison voltage value is higher than the compensatory comparison voltage value and the direct current value in the negative direction as the present direct current value if the comparison voltage value is lower than the compensatory comparison voltage value.

Figure 6:
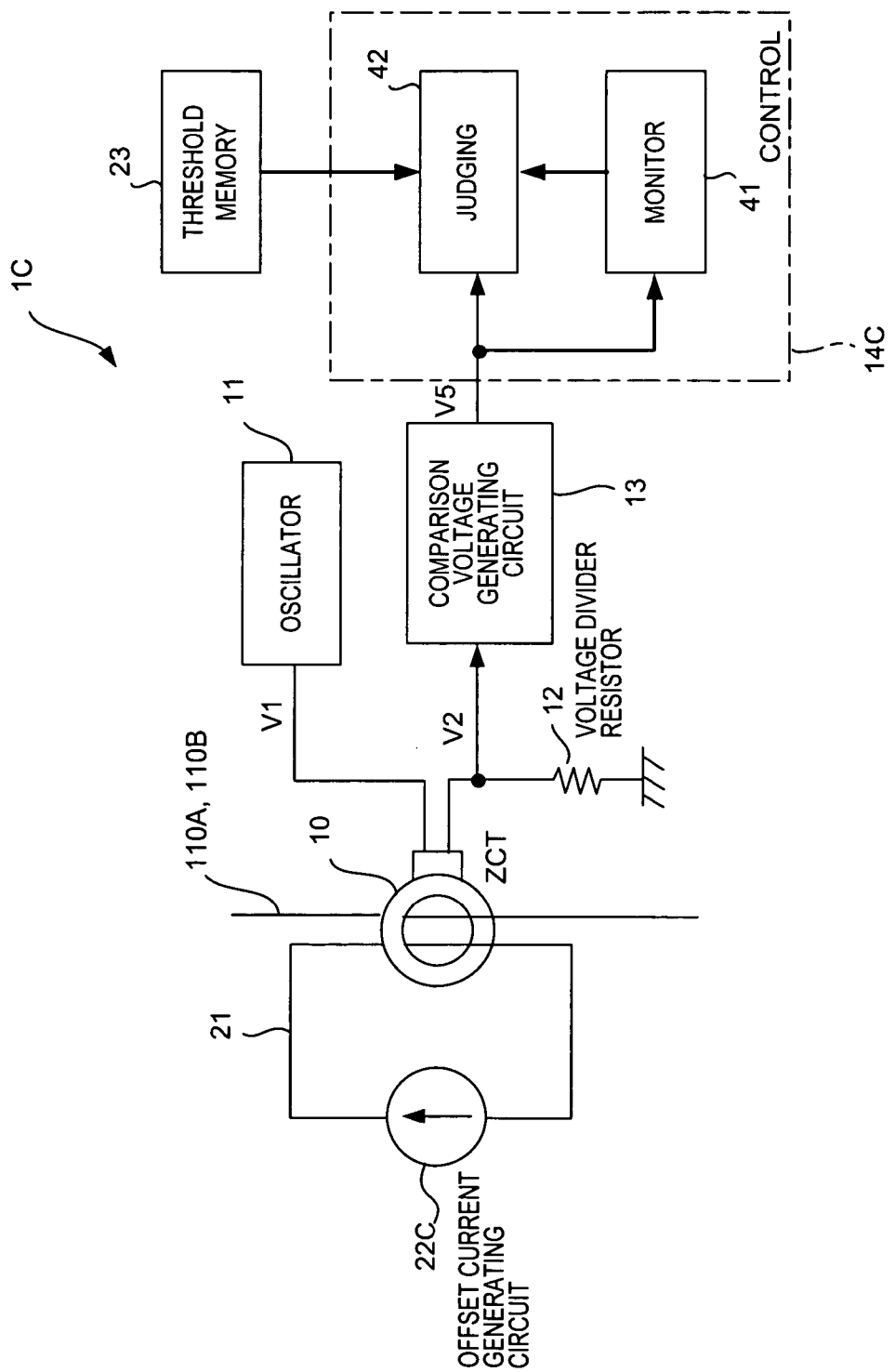
FIG. 6 is a block diagram of the inner structure of a direct grounding current detection circuit according to a third embodiment of the invention.

FIG. 6 is a block diagram of still another direct grounding current detection circuit 1C according to a third embodiment of this invention, adapted to be able to determine whether a direct grounding current is in the positive or negative direction although its occurrence takes place suddenly. Components which are substantially the same as those shown above in FIG. 1 are indicated by the same numerals and their structures and functions may not be described repetitiously.

The direct grounding current detection circuit 1C shown in FIG. 6 comprises not only a ZCT 10 with source lines 110A and 110B and an offset current wire 21 passing therethrough, an oscillator circuit 11, a comparison voltage generating circuit 13 and a threshold memory 23 but also an offset current generating circuit 22C adapted to generate an offset current having different current values for each of specified periods and a control circuit 14C which concludes that a direct grounding current has occurred relative to the source lines 110A and 110B if it is judged that the comparison voltage value V5 is equal to or above the upper threshold value VA or equal to or below the lower threshold value VB.

For example, the offset current generating circuit 22C may be adapted to output an offset current of +58 mA and +60 mA alternately at a specified period such as 20 ms.

The control circuit 14C comprises a monitoring circuit 41 for monitoring the shift in the offset current value and the comparison voltage value V5 when it is judged that a direct grounding current relative to the source lines 110A and 110B has occurred and a judging circuit 42 for judging the occurrence of a direct grounding current in the positive or negative direction on the basis of the result of monitoring by the monitoring circuit 41.

If the result of the monitoring by the monitoring circuit 41 is such that the comparison voltage value V5 increases as the offset current value increases, the judging circuit 42 judges that a direct grounding current in the positive direction has occurred. If the monitoring circuit 41 detects that the comparison voltage value V5 decreases as the offset current value increases, however, it is judged that a direct grounding current in the negative direction has occurred.

Figures 7, 8:
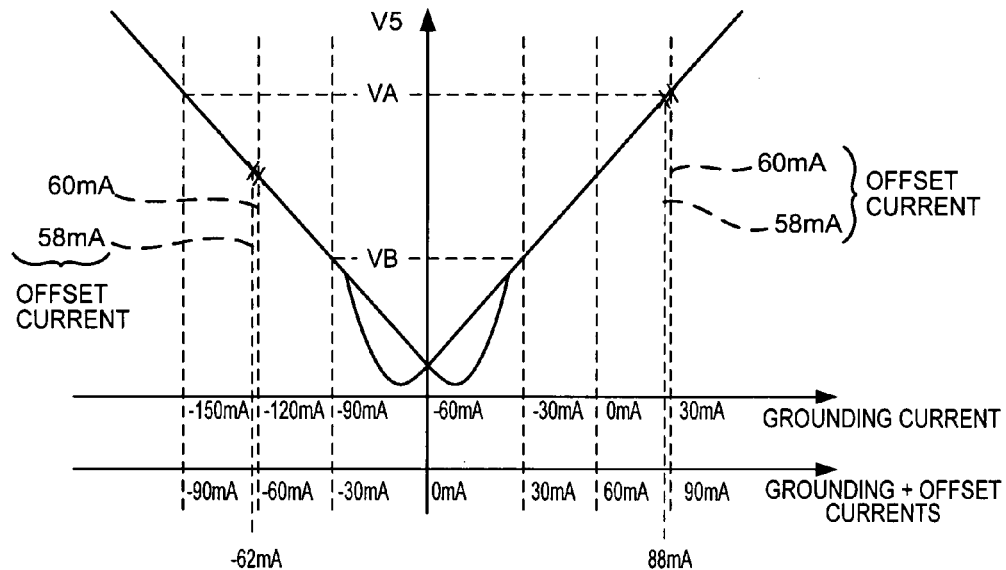
FIG. 7 is a graph for showing the relationship between the comparison voltage value and the direct current value for the direct grounding current detection circuit of FIG. 6 according to the third embodiment of the invention.
FIG. 8 shows an example of relationship between the direct grounding current and the shift in the comparison voltage value for the direct grounding current detection circuit of FIG. 6 according to the third embodiment of the invention.

The judgment process as described above is explained next with reference to FIG. 7 which shows the relationship between the comparison voltage value V5 and the direct current values (the direct ground current and the sum of the direct ground current and the offset current) in the case of the direct grounding current detection circuit 1C according to the third embodiment of the invention and FIG. 8 which shows an example of relationship between the shift and the direct grounding current.

Let us assume that there was a direct grounding current of +30 mA. As shown in FIGS. 7 and 8, the total current (the direct grounding and offset currents) will be +90 mA when the offset current is +60 mA but the total current will be +88 mA when the offset current is 58 mA. It can also be understood for this case that the comparison voltage value V5 when the offset current is +60 mA is higher than when the offset current is +58 mA. FIGS. 7 and 8 also show that when there is a direct grounding current of 0 mA, the comparison voltage value V5 when the offset current is +60 mA is higher than that when the offset current is +58 mA. In such cases, the comparison voltage value is said to shift higher as the offset current increases.

Let us next assume that there was a direct grounding current of −120 mA. As shown in FIGS. 7 and 8, the total current that flows is −60 mA when the offset current is +60 mA but it is −62 mA when the offset current is +58 mA. It can also be understood for this case that the comparison voltage value V5 when the offset current is +58 mA is higher than when the offset current is +60 mA. Similarly, if it is assumed that there was a direct grounding current of −90 mA, the comparison voltage value V5 when the offset current is +58 mA is higher than that when the offset current is +60 mA. In such cases, the comparison voltage value is said to shift lower as the offset current increases.

Next, the operation of the comparison voltage generating circuit 1C according to the third embodiment of the invention will be described.

When it is judged that a direct grounding current has occurred, the monitoring circuit 41 serves to monitor the shift in the comparison voltage value 5 as the offset current changes from +58 mA to +60 mA. On the basis of the monitoring by the monitoring circuit 41, the judging circuit 42 concludes that the direct grounding current is in the positive direction if the comparison voltage value V5 shifts higher as the offset current increases, that is, if the comparison voltage value V5 is higher when the offset current is +60 mA than when the offset current is +58 mA. Similarly, the judging circuit 42 concludes that the direct grounding current is in the negative direction if the comparison voltage value V5 shifts lower as the offset current increases, that is, if the comparison voltage value V5 is lower when the offset current is +60 mA than when the offset current is +58 mA.

In summary, the third embodiment is characterized as causing offset currents with different current values to flow at specified periods and monitoring the shift in the comparison voltage value V5 when the occurrence of a direct grounding current is determined relative to source lines 110A and 110B such that the direct grounding current is judged to be in the positive direction if the shift is to increase the comparison voltage value as the offset current increases and it is judged to be in the negative direction if the shift is to decrease the comparison voltage value as the offset current increases. Thus, according to this embodiment, too, the direct grounding current can be detected accurately even if its occurrence is sudden without the influence of the hysteresis characteristic of the ZCT 10.

It also goes without saying that the third embodiment of this invention described above as applied to a direct grounding current detection circuit can be equally applicable to a direct current detection circuit for detecting a direct current value in either positive or negative direction. This may be done by calculating the direct current values in the positive and negative directions on the basis of the comparison voltage value and monitoring the shift in the comparison voltage value as the offset current is varied. The calculated direct current value in the positive direction is determined to be the present current value if the shift is to increase the comparison voltage value as the offset current is increased and the calculated direct current value in the negative direction is determined to be the present current value if the shift is to decrease the comparison voltage value as the offset current is increased.

Figure 9:
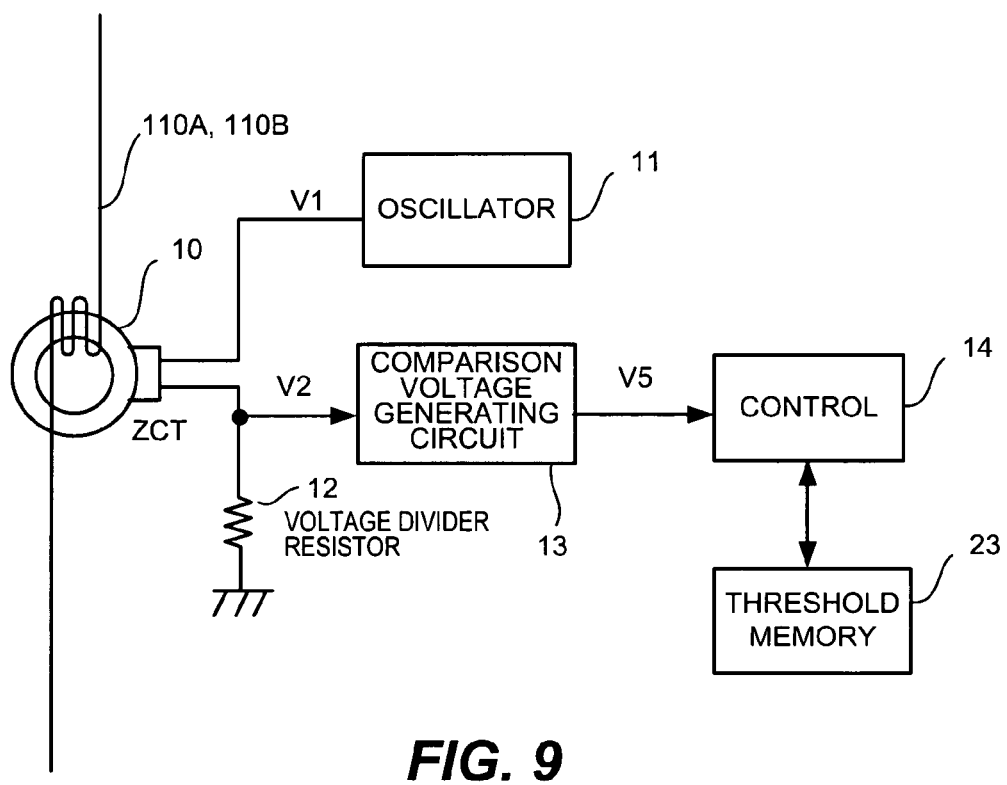
FIG. 9 is a block diagram of the inner structure of a direct grounding current detection circuit according to a fourth embodiment of the invention.

FIG. 9 is a block diagram of still another direct grounding current detection circuit 1D according to a fourth embodiment of this invention. Components which are substantially the same as those shown above in FIG. 1 are indicated by the same numerals and their structures and functions may not be described repetitiously.

The direct grounding current detection circuit 1D shown in FIG. 9 not only comprises a ZCT 10 with source lines 110A and 110B, an oscillator circuit 11, a comparison voltage generating circuit 13 and a threshold memory 23 but is also characterized wherein the source lines 110A and 110B are passed through the ZCT 10 more than once such that the range of direct grounding current value which is difficult to detect on the basis of the comparison voltage value V5 is shifted sufficiently into a new range where such detection is enabled. Explained in other words, the direct grounding current is added more than once if the source lines 110A and 110B are passed through the ZCT 10 a plural number of times.

The operation of the direct grounding current detection circuit 1D according to the fourth embodiment of the invention will be explained next by way of an example wherein the source lines 110A and 110B are passed three times through the ZCT 10. Thus, if there is a direct grounding current of +20 mA through the source lines 110A and 110B, it has the same effect as a current of +60 mA passing through the ZCT 10. The comparison voltage generating circuit 13 generates the comparison voltage value V5 based on the divided voltage V2 obtained between the ZCT 10 and the voltage divider resistor 12 according to the change in the impedance of the ZCT 10 and the control circuit 14 detects the occurrence of a direct grounding current if the comparison voltage value V5 is equal to or above the upper threshold value VA or equal to or below the lower threshold value VB.

The direct grounding current detection circuit 1D according to the fourth embodiment of the invention is advantageous in that additional circuits such as an offset current generating circuit can be dispensed with because the occurrence of a direct grounding current can be accurately detected without being influenced by the hysteresis characteristic of the ZCT 10 merely by changing the number of times the source lines are passed through the ZCT 10.

It also goes without saying that the fourth embodiment of this invention described above as applied to a direct grounding current detection circuit can be equally applicable to a direct current detection circuit for detecting a direct current value without providing an offset current generating circuit but merely by changing the number of times the source lines are passed through the ZCT 10. In this case, with the source lines 110A and 110B being passed through the ZCT 10 a plural number of times, a current value may be calculated on the basis of the comparison voltage value V5 and a direct current value calculated from this value and the value of the current that passes through the ZCT 10 may be detected as the present direct current value.

In summary, the present invention makes it possible to accurately detect a present direct current value such as a direct ground current value that may be so small for detection on the basis of a comparison voltage value.

What is claimed is:

1. A direct current detection circuit comprising:
   a zero-phase current transformer having source lines inserted therethrough and being adapted to magnetically detect current differences among said source lines and to vary self-impedance according to changes in magnetic field generated by said current difference;
   a voltage divider resistor connected in series to said zero-phase current transformer;
   a comparison voltage generating circuit for generating a comparison voltage value based on a divided voltage value obtained between said zero-phase current transformer and said voltage divider resistor according to a change in said self-impedance of said zero-phase current transformer;
   a control circuit for detecting a present direct current value based on said comparison voltage value generated by said comparison voltage generating circuit;
   an offset current line which is inserted through said zero-phase current transformer; and
   an offset current generating circuit provided separate from said source lines for constantly generating a constant offset current through said offset current line to make it possible to detect on the basis of said comparison voltage value a direct current value in a range which is difficult to detect accurately on the basis of said comparison voltage value without said offset current because of influence of hysteresis characteristic of said zero-phase current transformer;
   wherein said control circuit is adapted to detect a current value on the basis of said comparison voltage value generated by said comparison voltage generating circuit and to calculate said present direct current value on the basis of said detected value and the value of said offset current.

2. A direct current detection circuit comprising:
   a zero-phase current transformer having source lines inserted therethrough and being adapted to magnetically detect current differences among said source lines and to vary self-impedance according to changes in magnetic field generated by said current difference;
   a voltage divider resistor connected in series to said zero-phase current transformer;
   a comparison voltage generating circuit for generating a comparison voltage value based on a divided voltage value obtained between said zero-phase current transformer and said voltage divider resistor according to a change in said self-impedance of said zero-phase current transformer;
   a control circuit for detecting a present direct current value based on said comparison voltage value generated by said comparison voltage generating circuit;
   an offset current line which is inserted through said zero-phase current transformer;
   an offset current generating circuit for generating an offset current through said offset current line to make it possible to detect on the basis of said comparison voltage value a direct current value in a range which is difficult to detect accurately on the basis of said comparison voltage value without said offset current because of influence of hysteresis characteristic of said zero-phase current transformer;
   a compensatory zero-phase current transformer having same characteristics as said zero-phase current transformer, having said source lines inserted therethrough and having inserted therethrough said offset current line such that an opposite offset current in direction is detected thereby;
   a compensatory voltage divider resistor connected in series to said compensatory zero-phase current transformer; and
   a compensatory comparison voltage generating circuit for generating a compensatory comparison voltage value based on another divided voltage value obtained between said compensatory zero-phase current transformer and said compensatory voltage divider resistor according to a change in the self-impedance of said compensatory zero-phase current transformer;
   wherein said control circuit is adapted to detect a current value on the basis of said comparison voltage value generated by said comparison voltage generating circuit and to calculate said present direct current value on the basis of said detected value and the value of said offset current; and
   wherein said control circuit includes a current value calculating circuit and a present current value detecting circuit;
   said current value calculating circuit being adapted to detect a current value in a positive direction based on said comparison voltage value generated by said comparison voltage generating circuit, to calculate a direct current value in said positive direction based on said current value in said positive direction and the current value of said offset current, to detect a current value in a negative direction opposite said positive direction based on said compensatory comparison voltage value generated by said compensatory comparison voltage generating circuit, and to calculate a direct current value in said negative direction based on said current value in said negative direction and the current value of said offset current;
said present current value detection circuit being adapted to selectively detect said direct current value in said positive direction as said present direct current value if said comparison voltage value is judged to be higher than said compensatory comparison voltage value and to selectively detect said direct current value in said negative direction as said present direct current value if said compensatory comparison voltage value is judged to be higher than said comparison voltage value.

3. A direct current detection circuit comprising:
a zero-phase current transformer having source lines inserted therethrough and being adapted to magnetically detect current differences among said source lines and to vary self-impedance according to changes in magnetic field generated by said current difference;
a voltage divider resistor connected in series to said zero-phase current transformer;
a comparison voltage generating circuit for generating a comparison voltage value based on a divided voltage value obtained between said zero-phase current transformer and said voltage divider resistor according to a change in said self-impedance of said zero-phase current transformer;
a control circuit for detecting a present direct current value based on said comparison voltage value generated by said comparison voltage generating circuit;
an offset current line which is inserted through said zero-phase current transformer; and
an offset current generating circuit for generating an offset current through said offset current line to make it possible to detect on the basis of said comparison voltage value a direct current value in a range which is difficult to detect accurately on the basis of said comparison voltage value without said offset current because of influence of hysteresis characteristic of said zero-phase current transformer;
wherein said control circuit is adapted to detect a current value on the basis of said comparison voltage value generated by said comparison voltage generating circuit and to calculate said present direct current value on the basis of said detected value and the value of said offset current: and
wherein said offset current generating circuit generates an offset current with different current values for every specified period and said control circuit includes:
a direct current value calculating circuit for detecting current values in positive and negative directions based on said comparison voltage value generated by said comparison voltage generating circuit and calculating a direct current value in said positive direction based on said current value in said positive direction and the current value of said offset current and a direct current value in said negative direction based on said current value in said negative direction and the current value of said offset current;
a monitoring circuit for monitoring shift in relationship between the current value of said offset current and said comparison voltage value; and
a present current value detection circuit for detecting said direct current value in said positive direction as said present direct current value if said monitoring circuit finds that said comparison voltage value becomes higher as said offset current value becomes higher and detecting said direct current value in said negative direction as said present direct current value if said monitoring circuit finds that said comparison voltage value becomes lower as said offset current value becomes higher.

4. A direct grounding current detection circuit comprising:
a zero-phase current transformer having source lines inserted therethrough and being adapted to magnetically detect current differences among said source lines and to vary self-impedance according to changes in magnetic field generated by said current difference;
a voltage divider resistor connected in series to said zero-phase current transformer;
a comparison voltage generating circuit for generating a comparison voltage value based on a divided voltage value obtained between said zero-phase current transformer and said voltage divider resistor according to a change in said self-impedance of said zero-phase current transformer;
a control circuit for detecting presence or absence of direct grounding current relative to said source lines based on said comparison voltage value generated by said comparison voltage generating circuit;
an offset current line which is inserted through said zero-phase current transformer;
an offset current generating circuit for generating an offset current through said offset current line so as to shift a range of current values where it is difficult to accurately detect a direct current value of said direct grounding current because of influence of hysteresis characteristic of said zero-phase current transformer into a detectable range where it is possible to detect the direct current value of said direct grounding current; and
a threshold memory storing an upper threshold value and a lower threshold value to be used in determining presence and absence of said direct grounding current in said detectable range;
wherein said control circuit is adapted to conclude that there is occurrence of said direct grounding current relative to said source lines if it is judged that said comparison voltage value generated by said comparison voltage generating circuit is equal to or above said upper threshold value or equal to or below said lower threshold value.

5. The direct grounding current detection circuit of claim 4 further comprising:
a compensatory zero-phase current transformer having same characteristics as said zero-phase current transformer, having said source lines inserted therethrough and having inserted therethrough said offset current line such that an opposite offset current in direction is detected thereby;
a compensatory voltage divider resistor connected in series to said compensatory zero-phase current transformer; and
a compensatory comparison voltage generating circuit for generating a compensatory comparison voltage value based on another divided voltage value obtained between said compensatory zero-phase current transformer and said compensatory voltage divider resistor according to a change in the self-impedance of said compensatory zero-phase current transformer;
wherein said control circuit includes a judging circuit adapted to judge that a direct grounding current has occurred in a positive direction if said comparison voltage value generated by said comparison voltage generating circuit is equal to or above said upper threshold value and that a direct grounding current has occurred in a negative direction opposite said positive direction if said compensatory comparison voltage value generated by said compensatory comparison voltage generating circuit is equal to or above said upper threshold value.

6. The direct grounding current detection circuit of claim 4 wherein said offset current generating circuit generates an offset current with different current values for every specified period and said control circuit includes:
- a monitoring circuit for monitoring shift in relationship between the current value of said offset current and said comparison voltage value when it is judged that a direct grounding current has occurred relative to said source lines; and
- a detection circuit for detecting said direct current value in a positive direction if said monitoring circuit finds that said comparison voltage value becomes higher as said offset current value becomes higher and detecting said direct current value in a negative direction opposite said positive direction if said monitoring circuit finds that said comparison voltage value becomes lower as said offset current value becomes higher.

7. A direct grounding current detection circuit comprising:
- a zero-phase current transformer having source lines inserted therethrough and being adapted to magnetically detect current differences among said source lines and to vary self-impedance according to changes in magnetic field generated by said current difference;
- a voltage divider resistor connected in series to said zero-phase current transformer;
- a comparison voltage generating circuit for generating a comparison voltage value based on a divided voltage value obtained between said zero-phase current transformer and said voltage divider resistor according to a change in said self-impedance of said zero-phase current transformer;
- a control circuit for detecting presence or absence of occurrence of a direct grounding current relative to said source lines based on said comparison voltage value generated by said comparison voltage generating circuit; and
- a threshold memory storing an upper threshold value and a lower threshold value to be used by said control circuit in determining presence and absence of said direct grounding current in a detectable range in which it is possible to detect the direct current value of said direct grounding current;

wherein said zero-phase current transformer has said source lines inserted therethrough a plural number of times so as to shift a range of direct current values where it is difficult to accurately detect a direct current value of said direct grounding current based on said comparison voltage value because of influence of hysteresis characteristic of said zero-phase current transformer into said detectable range.

* * * * *